United States Patent
Song et al.

(10) Patent No.: US 10,461,154 B1
(45) Date of Patent: Oct. 29, 2019

(54) BOTTOM ISOLATION FOR NANOSHEET TRANSISTORS ON BULK SUBSTRATE

(71) Applicant: INTERNATIONAL BUSINESS MACHINES CORPORATION, Armonk, NY (US)

(72) Inventors: Yi Song, Albany, NY (US); Chi-Chun Liu, Altamont, NY (US); Zhenxing Bi, Niskayuna, NY (US); Shogo Mochizuki, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/014,757

(22) Filed: Jun. 21, 2018

(51) Int. Cl.
 *H01L 29/06* (2006.01)
 *H01L 21/306* (2006.01)
 *H01L 21/02* (2006.01)
 *H01L 21/762* (2006.01)

(52) U.S. Cl.
 CPC .... *H01L 29/0649* (2013.01); *H01L 21/02601* (2013.01); *H01L 21/30604* (2013.01); *H01L 21/76224* (2013.01); *H01L 29/0673* (2013.01)

(58) Field of Classification Search
 CPC .......... H01L 29/0673; H01L 21/76224; H01L 21/30604; H01L 21/02601; H01L 29/0649; H01L 21/76; H01L 21/7621; H01L 21/76208; H01L 21/76205; H01L 21/76232
 See application file for complete search history.

(56) References Cited

U.S. PATENT DOCUMENTS

| | | | | |
|---|---|---|---|---|
| 7,517,764 | B2 * | 4/2009 | Booth, Jr. | H01L 29/66795 257/E21.442 |
| 7,821,061 | B2 * | 10/2010 | Jin | B82Y 10/00 257/331 |
| 7,989,296 | B2 * | 8/2011 | Lee | H01L 29/66772 257/E21.43 |
| 8,293,616 | B2 * | 10/2012 | Chang | H01L 21/823878 438/405 |

(Continued)

OTHER PUBLICATIONS

Loubet et al., "Stacked Nanosheet Gate-All-Around Transistor to Enable Scaling Beyond FinFET", 2017 Symposium on VLSI Technology Digest of Technical Papers, Jun. 2017, pp. T230-231.

(Continued)

*Primary Examiner* — Earl N Taylor
(74) *Attorney, Agent, or Firm* — Tutunjian & Bitetto, P.C.; Vazken Alexanian

(57) ABSTRACT

A method of forming nanosheets that includes providing a stack of semiconductor material layers on a supporting bulk substrate. A first undercut region filled with a first dielectric material is formed extending from the opening into the bulk semiconductor substrate underlying the semiconductor material layers of the at least two stacks of semiconductor material layers. A second undercut region into the bulk semiconductor substrate filled with a second dielectric material from a side of the at least two stacks of semiconductor material layers that is opposite a side of the at least two stacks of semiconductor material layer at which the first undercut region is positioned. The first and second dielectric material merged that provide a full isolation region.

16 Claims, 6 Drawing Sheets

(56) References Cited

U.S. PATENT DOCUMENTS

| | | | | |
|---|---|---|---|---|
| 8,889,564 | B2* | 11/2014 | Cheng | H01L 29/78696 257/E21.633 |
| 8,936,972 | B2* | 1/2015 | Bangsaruntip | H01L 29/775 257/9 |
| 9,041,106 | B2* | 5/2015 | Cappellani | H01L 29/786 257/347 |
| 9,184,269 | B2* | 11/2015 | Ching | H01L 21/823821 |
| 9,224,841 | B2* | 12/2015 | Harame | H01L 21/76224 |
| 9,620,590 | B1* | 4/2017 | Bergendahl | H01L 29/0673 |
| 9,634,091 | B2* | 4/2017 | Ching | H01L 21/823821 |
| 9,647,139 | B2* | 5/2017 | Doris | H01L 21/0228 |
| 9,685,539 | B1* | 6/2017 | Cheng | H01L 29/66795 |
| 9,812,321 | B2* | 11/2017 | Doris | H01L 21/0228 |
| 9,871,099 | B2* | 1/2018 | Pranatharthiharan | H01L 29/0649 |
| 9,881,998 | B1* | 1/2018 | Cheng | H01L 29/0649 |
| 9,911,592 | B2* | 3/2018 | Doris | H01L 21/0228 |
| 9,929,266 | B2* | 3/2018 | Balakrishnan | H01L 29/778 |
| 9,935,016 | B2* | 4/2018 | Ching | H01L 21/823821 |
| 10,096,607 | B1* | 10/2018 | Guillorn | H01L 21/8221 |
| 10,163,729 | B2* | 12/2018 | Ching | H01L 21/823821 |
| 10,170,548 | B2* | 1/2019 | Cheng | H01L 29/0665 |
| 2006/0049429 | A1* | 3/2006 | Kim | H01L 29/42384 257/213 |
| 2008/0237575 | A1* | 10/2008 | Jin | B82Y 10/00 257/19 |
| 2009/0170251 | A1* | 7/2009 | Jin | B82Y 10/00 438/197 |
| 2010/0163971 | A1* | 7/2010 | Hung | H01L 29/66795 257/327 |
| 2011/0193175 | A1* | 8/2011 | Huang | H01L 21/823431 257/386 |
| 2013/0270512 | A1* | 10/2013 | Radosavljevic | H01L 21/82382 257/9 |
| 2013/0320455 | A1* | 12/2013 | Cappellani | H01L 29/66795 257/368 |
| 2014/0051213 | A1* | 2/2014 | Chang | B82Y 10/00 438/151 |
| 2014/0084342 | A1* | 3/2014 | Cappellani | B82Y 10/00 257/192 |
| 2014/0091360 | A1* | 4/2014 | Pillarisetty | H01L 29/7853 257/190 |
| 2014/0225065 | A1* | 8/2014 | Rachmady | H01L 29/42392 257/24 |
| 2014/0312432 | A1* | 10/2014 | Ching | H01L 29/66795 257/401 |
| 2015/0035071 | A1* | 2/2015 | Ching | H01L 27/092 257/369 |
| 2015/0206746 | A1* | 7/2015 | Harame | H01L 21/76224 257/365 |
| 2015/0303258 | A1* | 10/2015 | Kuhn | B82Y 10/00 257/192 |
| 2016/0071931 | A1* | 3/2016 | Cheng | H01L 29/0245 257/329 |
| 2017/0069481 | A1* | 3/2017 | Doris | H01L 21/0228 |
| 2017/0069734 | A1* | 3/2017 | Doris | H01L 21/0228 |
| 2017/0069763 | A1* | 3/2017 | Doris | H01L 21/0228 |
| 2017/0110554 | A1* | 4/2017 | Tak | H01L 29/4991 |
| 2017/0213911 | A1* | 7/2017 | Balakrishnan | H01L 29/778 |
| 2017/0229556 | A1* | 8/2017 | Anderson | H01L 29/66795 |
| 2017/0317168 | A1* | 11/2017 | Cheng | H01L 21/76213 |
| 2018/0006113 | A1* | 1/2018 | Cheng | H01L 29/0665 |
| 2018/0047853 | A1* | 2/2018 | Chang | H01L 29/78696 |
| 2018/0158952 | A1* | 6/2018 | Balakrishnan | H01L 29/778 |
| 2018/0219066 | A1* | 8/2018 | Cheng | H01L 29/0665 |

OTHER PUBLICATIONS

Anonymous et al. "Side-Anchoring Silicon-on-Nothing", ip.com, IP.com No. IPCOM000250006D, May 2017, 6 pages.

* cited by examiner

BOTTOM ISOLATION FOR NANOSHEET TRANSISTORS ON BULK SUBSTRATE

BACKGROUND

Technical Field

The present disclosure relates to semiconductor devices, and more particularly to semiconductor devices including channel regions integrated within nanowires and nanosheets.

Description of the Related Art

With the continuing trend towards miniaturization of integrated circuits (ICs), there is a need for transistors to have higher drive currents with increasingly smaller dimensions. The use of non-planar semiconductor devices such as, for example, nanowire and nano-sheet transistors may be the next step in the evolution of complementary metal oxide semiconductor (CMOS) devices.

SUMMARY

In one aspect, a method is provided for forming nanosheets separated from the semiconductor material of a bulk semiconductor substrate by an isolation region. In one embodiment, the method includes providing at least two stacks of semiconductor material layers on a supporting bulk substrate. A supporting dielectric layer is deposited over the at least two stacks having an opening exposing the space between adjacent stacks of semiconductor material layer for the at least two stacks of semiconductor material. Forming a first undercut region filled with a first dielectric material extending from the opening into the bulk semiconductor substrate underlying the semiconductor material layers of the at least two stacks of semiconductor material layers. Removing the supporting dielectric layer. Forming a second undercut region into the bulk semiconductor substrate filled with a second dielectric material from a side of the at least two stacks of semiconductor material layers that is opposite a side of the at least two stacks of semiconductor material layer at which the first undercut region is positioned. The first and second dielectric material provide an isolation region underlying an entirety semiconductor material layers of the at least two stacks of semiconductor material layers. Removing a sacrificial material layer from the semiconductor material layers in the at least two stacks of semiconductor material layers to provide nanosheets suspended over the isolation region.

In another aspect, a method of forming a suspended channel field effect transistor (FET) is provided in which an isolation region is formed between a bulk semiconductor substrate and the nanosheet structures of the suspended channel field effect transistor (alternatively referred to as nanosheet device).

In one embodiment, the method includes providing at least two stacks of semiconductor material layers on a supporting bulk substrate, and forming a spacer abutting sidewalls of the at least two stacks. A supporting dielectric layer is deposited over the at least two stacks having an opening exposing the space between adjacent stacks of semiconductor material layer for the at least two stacks of semiconductor material. Forming a first undercut region extending from the opening into the bulk semiconductor substrate underlying the semiconductor material layers of the at least two stacks of semiconductor material layers. Filling the first undercut region with a first dielectric material. Removing the supporting dielectric layer. Forming a second undercut region into the bulk semiconductor substrate from a side of the at least two stacks of semiconductor material layers that is opposite a side of the at least two stacks of semiconductor material layer at which the first undercut region is positioned. A second dielectric material fills the second undercut region, wherein the first and second dielectric material provide an isolation region underlying an entirety semiconductor material layers. Positioning a channel region of a semiconductor device in nanosheet provided at least one of the stacks of semiconductor material layers.

In yet another aspect, a semiconductor device is described including a plurality of nanosheets electrically isolated from a supporting bulk semiconductor substrate by an isolation region. In one embodiment, the semiconductor device comprise a bulk semiconductor substrate; and an isolation region present in an upper surface of the bulk semiconductor substrate, the isolation region comprised of two dielectric fill regions having an interface centrally positioned within the isolation region. A plurality of nanosheets are present overlying the isolation region, wherein the interface of the two dielectric fill regions is substantially centrally positioned under the width of the plurality of nanosheets. A gate structure present on a channel region portion of the plurality of nanosheets. Source and drain regions on opposing sides of the channel region portion of the plurality of nanosheets.

BRIEF DESCRIPTION OF DRAWINGS

The disclosure will provide details in the following description of preferred embodiments with reference to the following figures wherein.

DETAILED DESCRIPTION

Figure 1:
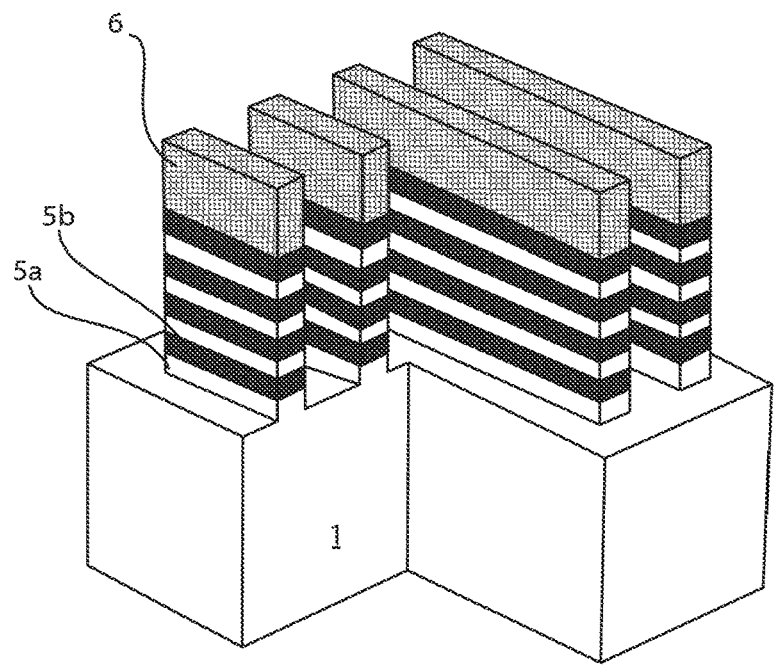
FIG. 1 is a perspective view having a cross-section depicting forming a plurality of stacks of semiconductor material layers overlying a bulk semiconductor substrate, in accordance with one embodiment of the present disclosure.

Detailed embodiments of the claimed methods, structures and computer products are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. For purposes of the description hereinafter, the terms "upper", "over", "overlying", "lower", "under", "underlying", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In one aspect, embodiments of the present disclosure describe a way to provide a bottom isolation region for nanosheet transistors that are formed on a bulk substrate. Without isolation, nanosheet transistors built on bulk substrates can suffer high leakage problems due to source/drain leakage through the substrate. However, it has been determined that current methods for providing nanosheet isolation, which rely upon the formation of a silicon germanium layer having a high germanium percentage and dielectric properties being formed at the base of nanosheets, can result in increased defect formation. The presence of high germanium concentration silicon germanium also increase the sensitivity of the device to thermal budget during manufacturing. The silicon germanium can also increase process complexity with respect to the requirements of epitaxial growth and selective etching. The methods and structures of the present disclosure can provide for nanosheet isolation without using high germanium concentration silicon germanium, hence providing a simplified method for bottom isolation of the nanosheets. Further details regarding the method and structures of the present disclosure are now described with reference to FIGS. 1-14.

FIG. 1 depicts forming a plurality of stacks 10 of semiconductor material layers 5a, 5b overlying a bulk semiconductor substrate 1. The stacks 10 of semiconductor material layers 5a, 5b are ultimately processed to provide nanosheets, and include at least one sacrificial layer 5b that is removed selectively to a nanosheet semiconductor layer 5a. The substrate 1 may be composed of a supporting material, such as a semiconductor material, e.g., a type IV semiconductor, such as silicon (Si). The substrate 1 may be composed of a bulk semiconductor, and therefore may be referred to as a bulk semiconductor substrate. A bulk semiconductor substrate is composed of a single semiconductor material. This is distinguished from a multi-material substrate, such as a silicon on insulator (SOI) substrate, which includes an integral dielectric layer, such as a buried oxide layer.

The stack 10 of the at least two semiconductor materials 5a, 5b is typically composed of two alternating materials. For example, the first semiconductor material 5b, i.e., sacrificial semiconductor material, that is present on the substrate 1 may be composed of a silicon and germanium containing semiconductor material, such as silicon germanium (SiGe), whereas the second semiconductor material 5a, i.e., nanosheet semiconductor material layer, that is present on the first semiconductor material 5b may be composed of a germanium free silicon containing semiconductor material, such as silicon (Si). It is noted that this is only one example of semiconductor materials that may be used for the at least two semiconductor materials 5a, 5b. Any semiconductor material composition may be used for each of the at least two semiconductor materials 5a, 5b so long as at least one of the compositions selected allow for selective etching between at least two of them. Any type IV semiconductor composition combination and/or III-V semiconductor composition combination is suitable for use with the present disclosure. For example, the compositions selected for the at least two semiconductor materials include Si, SiGe, SiGeC, SiC, single crystal Si, polysilicon, i.e., polySi, epitaxial silicon, i.e., epi-Si, amorphous Si, i.e., α:Si, germanium, gallium arsenide, gallium nitride, cadmium telluride and zinc sellenide.

Although FIG. 1 only depicts two semiconductor material layers in the stack 10 of the at least two semiconductor materials 5a, 5b, it is noted that the present disclosure is not limited to only this example. Any number of semiconductor material layers 5a, 5b may be present in the stack 10. For example, the number of semiconductor material layers 5a, 5b in the stack may also be equal to 3, 4, 5, 10, 15 and 20, as well as any value between the aforementioned examples.

The stack 10 of the at least two semiconductor materials 5a, 5b may be formed using a deposition process, such as chemical vapor deposition (CVD). Chemical vapor deposition (CVD) is a deposition process in which a deposited species is formed as a result of chemical reaction between gaseous reactants at greater than room temperature (25° C. to 900° C.); wherein solid product of the reaction is deposited on the surface on which a film, coating, or layer of the solid product is to be formed. Variations of CVD processes suitable for use the present disclosure include, but not limited to, Atmospheric Pressure CVD (APCVD), Low Pressure CVD (LPCVD) and Plasma Enhanced CVD (PECVD), Metal-Organic CVD (MOCVD) and combinations thereof may also be employed.

The thickness of each of the at least two semiconductor material layers 5a, 5b, may range from 1 nm to 30 nm. In another embodiment, the thickness of each of the at least two semiconductor material layers 5a, 5b, may range from 5 nm to 20 nm.

Following deposition, the semiconductor material layers 5a, 5b may be patterned to provide the geometry of the stack. In some embodiments, the semiconductor material layers 5a, 5b may be patterned using deposition, photolithography and subtractive etch processing. A stack dielectric cap 6 composed of a nitride, e.g., silicon nitride, or oxide, e.g., silicon oxide, can be used in combination with selective etching and photolithography to pattern the stacks 10 of semiconductor layers 5a, 5b. In one example, the stack 10 may have a height Hi ranging from 5 nm to 200 nm, and a width ranging from 5 nm to 60 nm.

Figure 2:
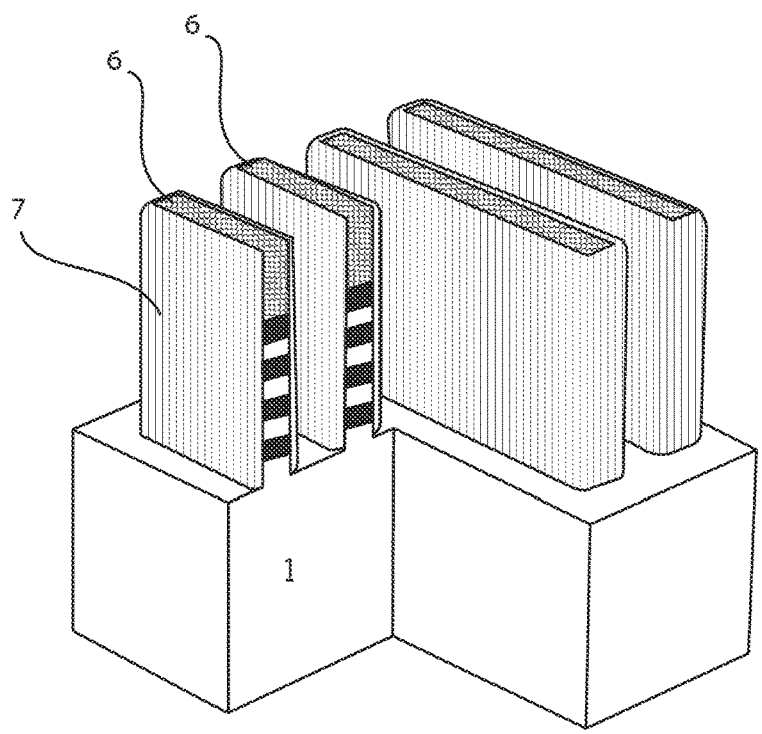
FIG. 2 is a perspective view having a cross-section depicting forming a spacer on the sidewall of the plurality of stacks of semiconductor material layers.

FIG. 2 depicts forming a spacer 7 on the sidewall of the plurality of stacks 10 of semiconductor material layers 5a, 5b. The spacer 7 can be composed of a dielectric material, such as an oxide, nitride, or oxynitride material. In one example, when the spacer 7 is composed of a nitride, the spacer 7 may be composed of silicon nitride, and when the spacer 7 is composed of oxide, the spacer 7 may be composed of silicon oxide. In another example, the spacer 7 may be composed of a low-k dielectric. In some examples, the low-k dielectric of the spacer 7 may have a dielectric constant of 4.0 or less (measured at room temperature, e.g., 25° C., and 1 atm). For example, a low-k dielectric material suitable for the spacer 7 may have a dielectric constant ranging from about 1.0 to about 3.0. Examples of low-k materials suitable for the spacer 7 include organosilicate glass (OSG), fluorine doped silicon dioxide, carbon doped silicon dioxide, porous silicon dioxide, porous carbon doped silicon dioxide, spin-on organic polymeric dielectrics (e.g., SILK™), spin-on silicone based polymeric dielectric (e.g., hydrogen silsesquioxane (HSQ) and methylsilsesquioxane (MSQ), and combinations thereof.

The spacer 7 may be formed using a deposition process, such as chemical vapor deposition (CVD), and an anisotropic etchback method. The spacer 7 may have a thickness ranging from 1 nm to 15 nm.

Following the formation of the spacer 7, isolation regions 8 may be formed in the bulk substrate 1. Forming the isolation regions 8 may begin with forming trenches in the bulk substrate 1. The trenches may be formed using an etch process, such as an anisotropic etch process, i.e., directional etch process. For example, the anisotropic etch process that can be used to form the trenches in the bulk substrate 1 can be reactive ion etching (RIE). The etch process may be selective to the spacer 7 and the sheet dielectric cap 6. The trenches may be filled with a dielectric material, such as an oxide, e.g., silicon oxide, and/or a nitride, e.g., silicon nitride. The dielectric material may be deposited into the trenches using chemical vapor deposition (CVD), such as plasma enhanced chemical vapor deposition (PECVD). Following deposition, the deposited material for the isolation regions 8 can be recessed to provide that the height of the isolation regions 8 that are formed in the bulk substrate 1 is below the lower surface of the semiconductor layers in the stack 10.

Figure 3:
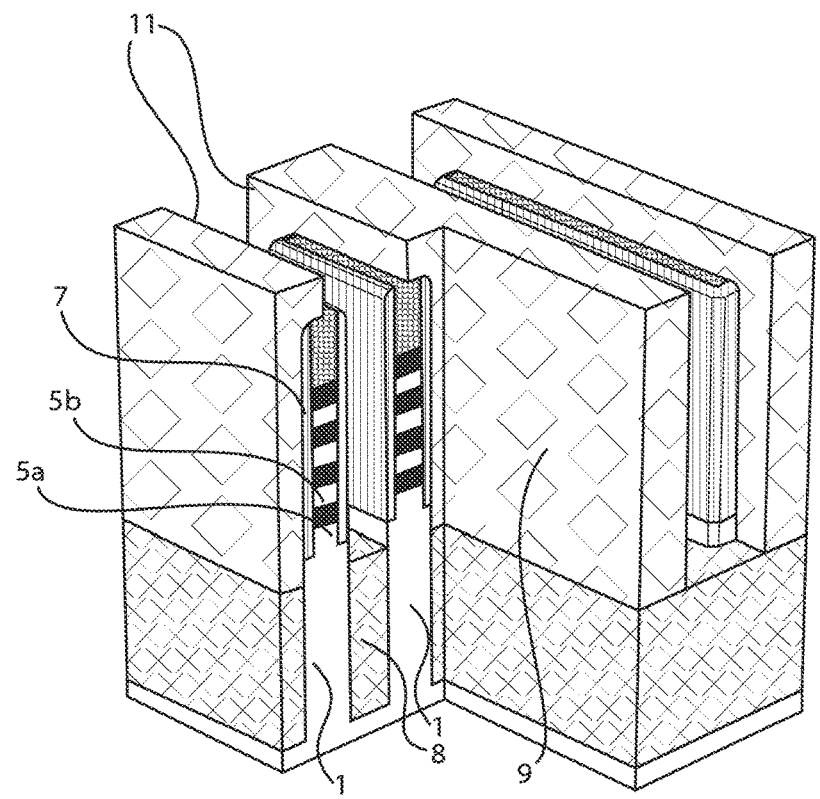
FIG. 3 is a perspective view having a cross-section depicting depositing a supporting layer over the at least two stacks having an opening exposing the space between adjacent stacks of semiconductor material layer for the at least two stacks of semiconductor material. Between the stacks, there are STI isolations underneath.

FIG. 3 depicts one embodiment of depositing a supporting dielectric layer 9 over the stacks 10 of the semiconductor material layers 5a, 5b having an opening exposing the space 11 between adjacent stacks 10 of semiconductor material layers 5a, 5b.

The supporting dielectric layer 9 may be an organic planarization layer. The organic planarization layer (OPL) layer that provides the supporting dielectric layer 9 may be composed of an organic polymer that may include polyacrylate resin, epoxy resin, phenol resin, polyamide resin, polyimide resin, unsaturated polyester resin, polyphenylenether resin, polyphenylenesulfide resin, or benzocyclobutene (BCB). The organic planarization layer (OPL) that provides the supporting dielectric layer 9 may be applied, for example, by spin coating. The supporting dielectric layer 9 may be deposited to a thickness that is greater than the height of the stacks 10 of semiconductor material layers 5a, 5b.

Still referring to FIG. 3, the organic planarization layer (OPL) that provides the supporting dielectric layer 9 may then patterned to provide the opening 11 that exposes the portion of the substrate 1 that is present between adjacent stacks 10 of semiconductor material layers 5a, 5b. More specifically, the supporting dielectric layer 9 may be patterned to provide an opening 11 that exposes the portion of the substrate 1, i.e., bulk semiconductor substrate, that is present between the spacer 7 that is present on sidewalls of adjacently positioned stacks 10 of the semiconductor material layers 5a, 5b. The supporting dielectric layer 9 may be patterned using photolithography and etch processes. More specifically, a photoresist mask may be formed over the organic planarization layer (OPL) that provides the supporting dielectric layer 9. More specifically, a photoresist layer may be deposited on the supporting dielectric layer 9, and may be patterned using photolithography, and developed to provide an etch mask. Following the formation of the etch mask, the supporting dielectric layer 9 may be etched using the etch mask, which forms the opening 11 in the supporting dielectric layer 9. Thereafter, the etch mask provided by the photoresist may be removed.

Figure 4:
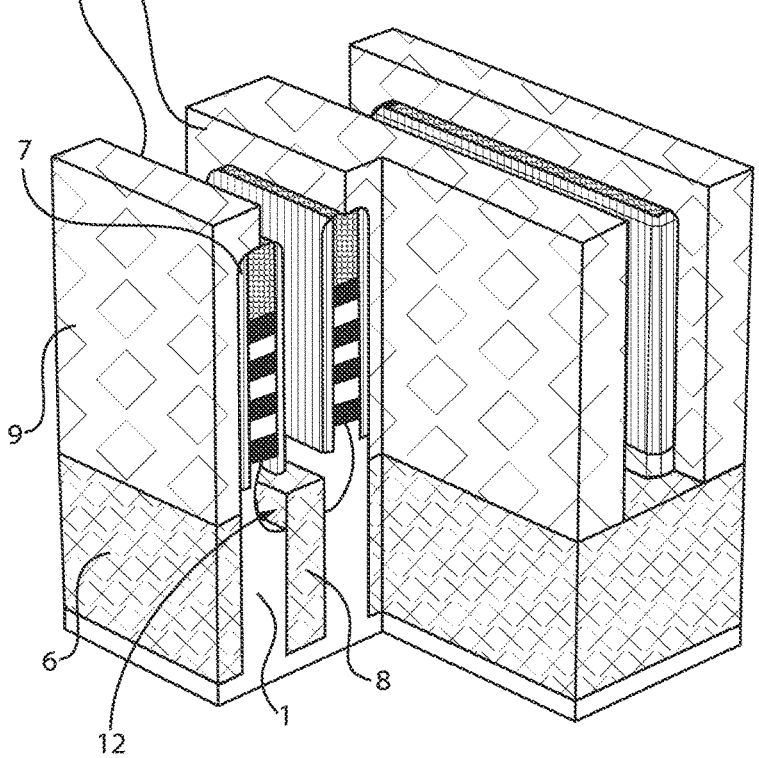
FIG. 4 is a perspective view having a cross-section depicting forming a first undercut region extending from the opening into the bulk semiconductor substrate underlying the semiconductor material layers of the at least two stacks of semiconductor material layers.

FIG. 4 depicts forming a first undercut region 12 extending from the opening 11 into the bulk semiconductor substrate 1 underlying the semiconductor material layers 5a, 5b of the stacks 10 of semiconductor material layers 5a, 5b. In some embodiments, the first undercut region 12 extends from a first sidewall of the stacks 10 of semiconductor material layers 5a, 5b to length substantially ½ the width of the semiconductor material layers 5a, 5b, or to a greater length. The etch process may be an isotropic etch. Contrary to anisotropic etching, which is a directional form of etching, isotropic etching is substantially non-directional. The etch process for forming the first undercut region 12 may be a selective etch process. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 10:1 or greater, e.g., 1000:1. For example, the etch process may remove the exposed portion of the supporting substrate 1 of a type IV semiconductor, such as silicon (Si), selectively to a silicon germanium (SiGe) composition semiconductor material layer 5a, 5b of the stack 10 of semiconductor material layer 5a, 5b.

In some embodiments, the selective etch process or forming the first undercut region 12 includes a three step etch process. In one embodiment, the first step of the etch process may include an ammonia gas and nitrogen trifluoride gas ($NH_3+NF_3$) or buffered hydrofluoric acid (BHF) based pre-clean etch for native oxide removal. The second step of the etch process that follows first step of the etch process may include a purely gas phase fluorine (F) precursor based isotropic chemical etch process (no plasma) for selective silicon etch. The third step of the etch process that follows second step of the etch process includes an in-situ long post heat treatment to remove etch byproducts. In some examples, the aforementioned example etch process can have an etch selectivity $Si:SiGe_{40} > 20:1$.

FIGS. 5-9 depict filling the first undercut region 12 with a first dielectric material 13. The first dielectric material 13 that fills the first undercut region 12 extends substantially from the first sidewall of the stack to substantially ½ the width, or greater, of the semiconductor material layers 5a, 5b of the stacks 10. The first dielectric material 13 also underlies the entirety of the length of the semiconductor material layers 5a, 5b of the stacks 10. As will be described further below, the combination of the first dielectric material 13 that fills the first undercut region 12, and the second dielectric material that fills the second undercut region, provides that the subsequently formed nanosheets are separated, and electrically isolated, from the bulk semiconductor substrate 1.

In some embodiments, the first dielectric material 13 is composed of an oxide, nitride or oxynitride material layer. For example, the first dielectric material 13 may be composed of silicon oxide ($SiO_2$). In another example, the first dielectric material 13 may be composed of silicon nitride, e.g., $Si_3N_4$, or silicon oxynitride, e.g., $SiO_xN_y$.

The first dielectric material 13 may also be composed of a low-k dielectric material. The first dielectric material 13 may be composed of a low-k dielectric material selected from the group consisting of organosilicate glass (OSG), fluorine doped silicon dioxide, carbon doped silicon dioxide, porous silicon dioxide, porous carbon doped silicon dioxide, hydrogen silsesquioxane (HSQ), methylsilsesquioxane (MSQ), silicon carbon boron nitride (SiCBN), and combinations thereof.

In yet other examples, the first dielectric material 13 can be composed of high-k dielectric materials which can include hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, nitrided hafnium silicate (HfSiON), lanthanum oxide ($La_3O_2$), lanthanum aluminate ($LaAlO_3$), zirconium silicate (ZrSiOx) and combinations thereof.

It is noted that the above compositions are only examples of dielectric compositions that can be suitable for forming the first dielectric material 13, and it is not intended that the present disclosure be limited to only those examples. Any material that is suitable for deposition using atomic layer deposition (ALD) methods may also be suitable for use with the methods and structures of the present disclosure so long as being suitable for filling the first undercut region 12.

Figure 5:
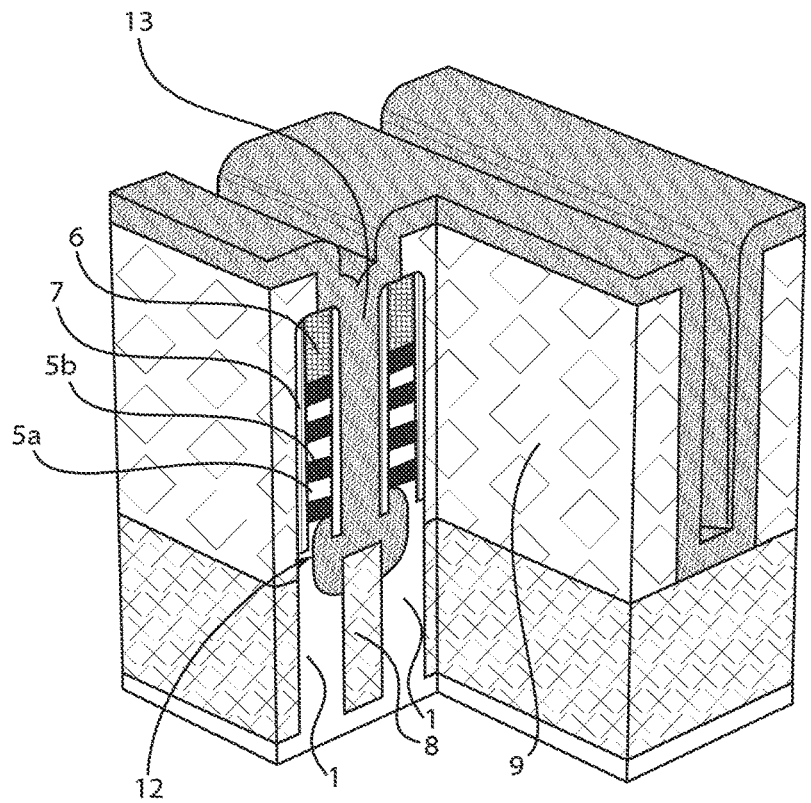
FIG. 5 is a perspective view having a cross-section depicting filling the first undercut region with a first dielectric material.

FIG. 5 depicts filling the first undercut region 12 with a first dielectric material 13, as well as filling the opening 11 between two stacks 10 of semiconductor material layers 5a, 5b. The first dielectric material 13 may be deposited using atomic layer deposition (ALD). Atomic Layer Deposition (ALD) uses self-limiting surface reactions to deposit material layers in the monolayer or sub-monolayer thickness regime. ALD is similar in chemistry to chemical vapor deposition (CVD), except that the ALD reaction breaks the CVD reaction into two half-reactions, keeping the precursor materials separate during the reaction. In some embodiments, the atomic layer deposition (ALD) process may be a thin film deposition method in which a film is grown on a deposition by exposing its surface to alternate gaseous species (typically referred to as precursors). In contrast to chemical vapor deposition, the precursors are never present simultaneously in the reactor, but they are inserted as a series of sequential, non-overlapping pulses. In each of these pulses the precursor molecules react with the surface in a self-limiting way, so that the reaction terminates once all the reactive sites on the surface are consumed. In some embodiments, the monolayer deposition provided by the atomic layer deposition (ALD) mechanisms provides that the layer be conformal. The term "conformal" denotes a layer having a thickness that does not deviate from greater than or less than 30% of an average value for the thickness of the layer.

In some embodiments, the atomic layer deposited (ALD) conformal dielectric layer that provides the first dielectric material 13 filling the first undercut region 12 is composed of multiple layers each being substantially conformal. Each layer may be composed of at least one monolayer. Each monolayer may correspond to a pulse of precursor material as part of the atomic layer deposition (ALD) process. For example, the atomic layer deposited (ALD) conformal dielectric layer 30 may be composed of 3 to 100 monolayers.

Figure 6:
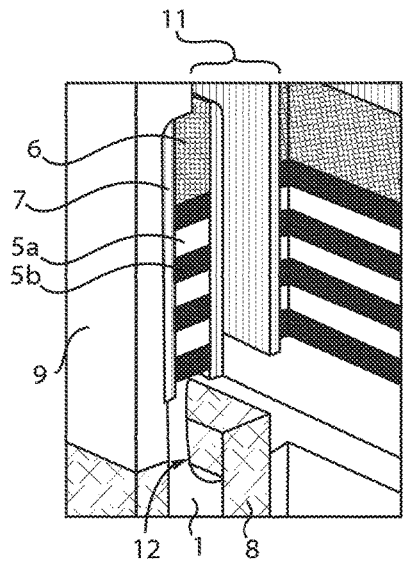
FIG. 6 is a magnified perspective view having a cross-section depicting the first undercut region prior to filling with the first dielectric material.
Figure 7:
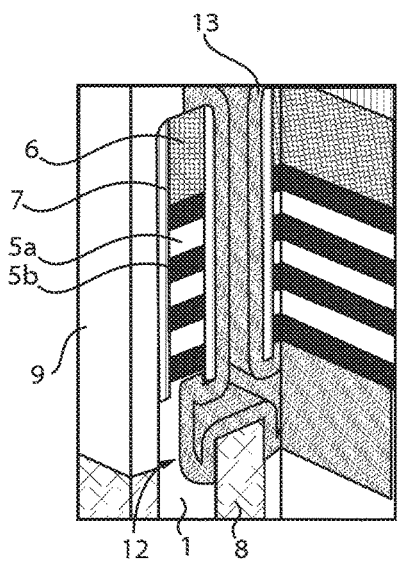
FIG. 7 is a magnified perspective view having a cross-section depicting filling the first undercut region with an approximately 5 nm thickness dielectric layer deposited by atomic layer deposition (ALD).
Figure 8:
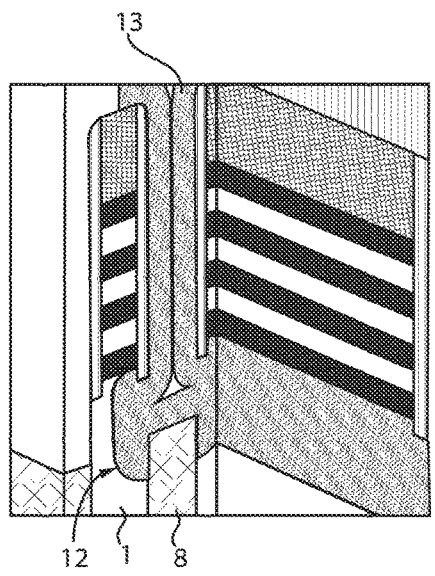
FIG. 8 is a magnified perspective view having a cross-section depicting filling the first undercut region with an approximately 10 nm thickness dielectric layer deposited by atomic layer deposition (ALD).
Figure 9:
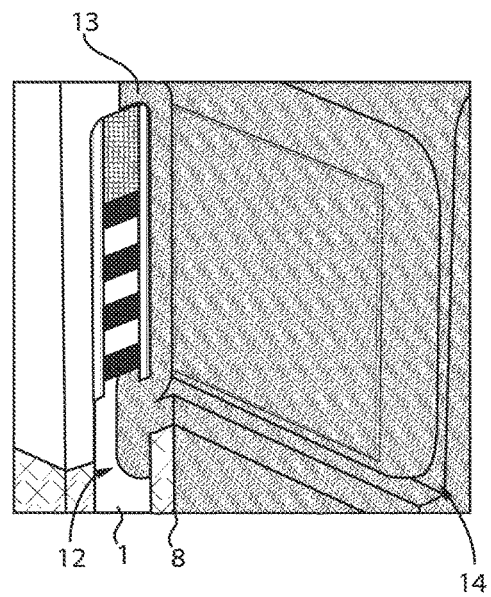
FIG. 9 is a magnified perspective view having a cross-section depicting filling the first undercut with a partial gap fill of the first dielectric material, wherein the partial gap fill shows pinch-off from the top, but the fin end have some room for the deposition reactant to enter the undercut region.

FIG. 6 is a magnified view depicting the first undercut region 12 prior to filling with the first dielectric material 13. FIG. 7 is a magnified view depicting filling the first undercut region with an approximately 5 nm thickness dielectric layer deposited by atomic layer deposition (ALD). FIG. 7 illustrates an initial stage of a conformal deposition of a conformal layer of a first dielectric material 13. The conformal layer of the first dielectric material 13 has substantially the same thickness on the sidewalls of the opening 11 and on the vertically and horizontally orientated portions of the first undercut region 12. FIG. 8 is a magnified cross-section taken across substantially the middle of the stack 10 depicting filling the first undercut region 12 with an approximately 10 nm thickness dielectric layer (that provides the first dielectric material 13) deposited by atomic layer deposition (ALD). FIG. 8 illustrates that the opening 11 is substantially filled pinching off the first undercut region 12, in which the majority, i.e., partial gap fill, of the first undercut region 12 is filled with the first mm dielectric material 13. FIG. 9 is a cross section taken from the end of the stack 10 of the semiconductor material layers 5a, 5b. FIG. 9 illustrates filling the first undercut 12 with a partial gap fill of the first dielectric material 13, wherein the partial gap fill shows pinch-off from the top, but the fin end 14 have plenty of room for the deposition reactant, i.e., atomic layer deposition (ALD) reactant, to enter the undercut region 12.

Figure 10:
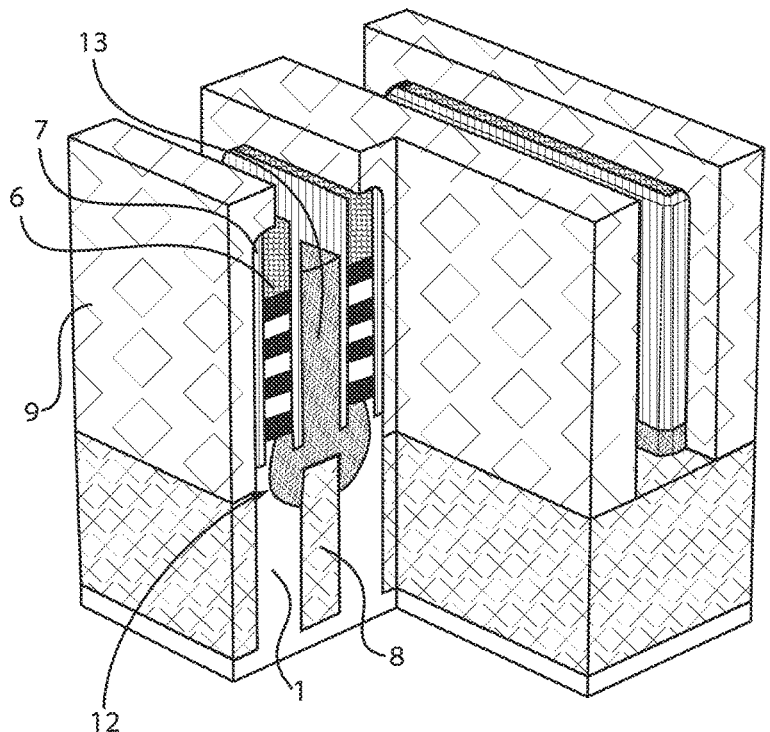
FIG. 10 is a perspective view having a cross-section depicting recessing the first dielectric material by isotropic etching that is present between the stacks of semiconductor material layers.

FIG. 10 depicts recessing the first dielectric material 13 that is present between the stacks 10 of semiconductor material layers 5a, 5b. The first dielectric material 13 may be recessed by diluted hydrofluoric (DHF) acid. Recessing the first dielectric material 13 may remove the first dielectric material 13 from the ends of the stacks 10 of the semiconductor material layers 5a, 5b. The purpose of this etch is to open to fin end for the following Silicon isotropic etch.

Figure 11:
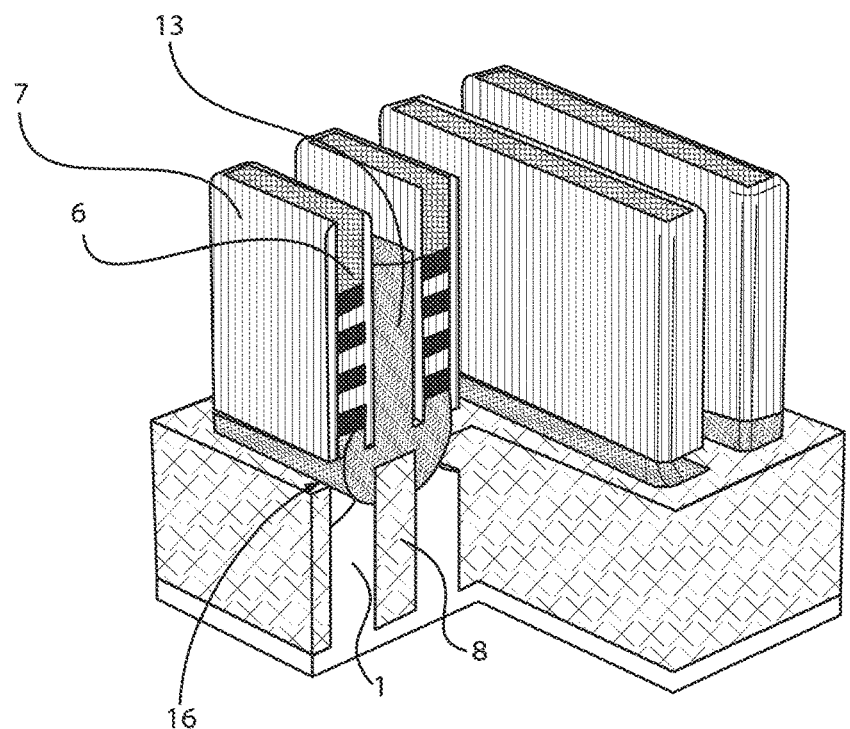
FIG. 11 is a perspective view having a cross-section depicting removing the supporting dielectric layer, and forming a second undercut region into the bulk semiconductor substrate from a side of the at least two stacks of semiconductor material layers that is opposite a side of the stack of semiconductor material layer at which the first undercut region is positioned.

FIG. 11 depicts removing the supporting dielectric layer 9, and forming a second undercut region 16 into the bulk semiconductor substrate 1 from a side of stack 10 of semiconductor material layers 5a, 5b that is opposite the side of the stack 10 of semiconductor material layers 5a, 5b at which the first undercut region 12 is positioned.

Removing the supporting dielectric layer 9 may include a selective etch process. For example, the supporting dielectric layer 9 may be removed by an etch chemistry that removes the material of the supporting dielectric layer 9 selectively to the dielectric cap 6 that is present on the stacks 10 of semiconductor material layers 5a, 5b, the spacer 7, the first dielectric material 13, and the semiconductor material of the bulk substrate 1. Following removal of the supporting dielectric layer 9, the second undercut region 16 is formed in the bulk semiconductor substrate 1. The second undercut region 16 can be formed using an isotropic etch similar to the isotropic etch that is described above for forming the first undercut region 12. The isotropic etch that forms the second undercut region 16 can remove a remainder of the semiconductor material of the bulk semiconductor substrate 1 that is present underlying the stacks 10 of semiconductor material layers 5a, 5b. During removal of the remainder of the semiconductor material from underlying the stacks 10 of semiconductor material layers 10, the stacks are supported by the first dielectric material 13 that is present in the first undercut region 12 and the opening 11.

Figure 12:
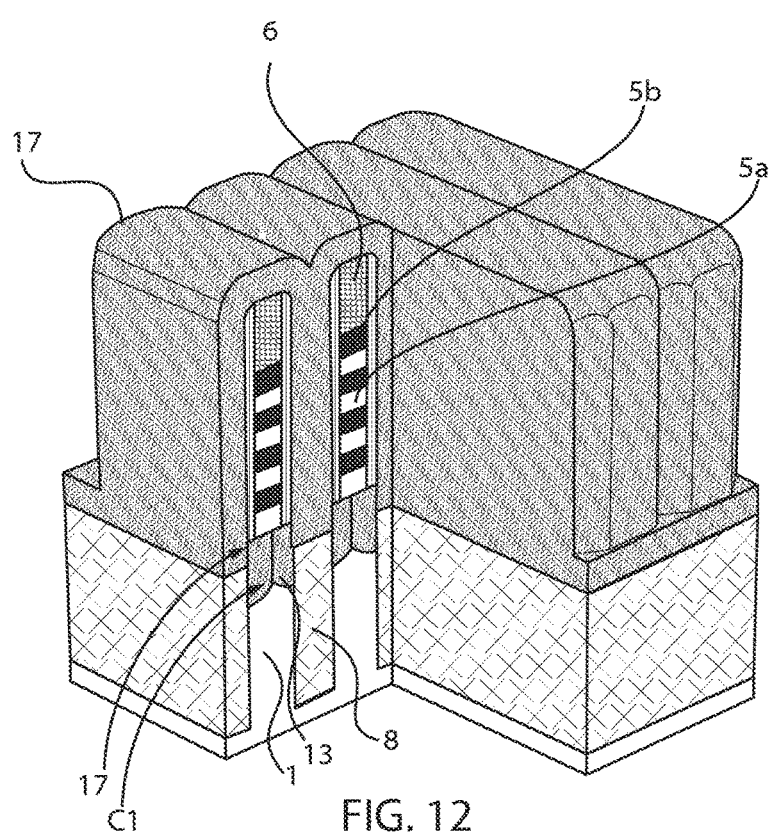
FIG. 12 is a perspective view having a cross section depicting forming a second dielectric material to fill the second undercut region.

FIG. 12 depicts forming a second dielectric material 17 to fill the second undercut region. The second dielectric material 17 that fills the second undercut region 16 extends substantially from the second sidewall of the stack to substantially ½ the width, or greater, of the semiconductor material layers 5a, 5b of the stacks 10. The second dielectric material 17 also underlies the entirety of the length of the semiconductor material layers 5a, 5b of the stacks 10. The combination of the first dielectric material 13 that fills the first undercut region 12, and the second dielectric material 17 that fills the second undercut region 16, provides that the subsequently formed nanosheets are separated, and electrically isolated, from the bulk semiconductor substrate 1.

The second dielectric material 17 is similar to the first dielectric material 13 that is described above with reference to FIGS. 5-9. Therefore, the description of the first dielectric material 13 depicted in FIGS. 5-9 is suitable for describing at least one example of the second dielectric material 17 that is depicted in FIG. 12. For example, the second dielectric material 17 may be composed of an oxide, nitride or oxynitride material layer. For example, the second dielectric material 17 may be composed of silicon oxide ($SiO_2$). In another example, the second dielectric material 17 may be composed of silicon nitride, e.g., $Si_3N_4$, or silicon oxynitride, e.g., $SiO_xN_y$. It is noted that these are only some examples of compositions that are suitable for the second dielectric material 17, and any composition that is described above for the first dielectric material 13 may also be employed for the second dielectric material 17. In some embodiments, the second dielectric material 17 and the first dielectric material 13 may be composed of the same composition dielectric material. In some embodiments, the second dielectric material 17 and the first dielectric material 13 may be composed of different composition dielectric materials.

The second dielectric material 17 that is depicted in FIG. 12 may be blanket deposited atop the structure depicted in FIG. 11 using atomic layer deposition (ALD). Blanket depositing the second dielectric material 17 by atomic layer deposition (ALD) fills the second undercut region 16 with the second dielectric material 17. Following deposition of the second dielectric material 17, an anisotropic etch process, such as reactive ion etching (RIE), removes a majority of the second dielectric material 17 that is not present in the second undercut region 16. In some embodiments, the etch process that removes the second dielectric material 17 is selective to the material of the spacer 20. In this example, the outer sidewall of the remaining portion of the second dielectric material is aligned with the outer sidewall of the spacer 20.

Figure 13:
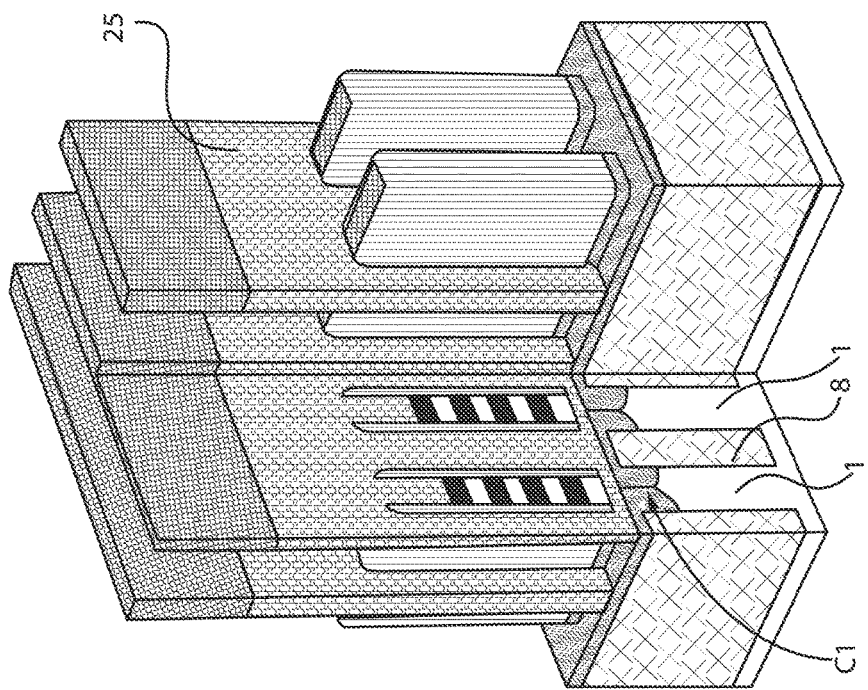
FIG. 13 is a perspective view having a cross section depicting forming a sacrificial gate structure on a channel region portions of the stack of semiconductor layers.

FIG. 13 depicts forming a sacrificial gate structure 25 on a channel region portions of the stack 10 of semiconductor layers 5a, 5b. By "sacrificial" it is meant that the structure is present during processing of the semiconductor device, but is removed from the semiconductor device prior to the device being completed. In the present process flow, a replacement gate structure 15 is employed as part of a replacement gate process. As used herein, the term "sacrificial gate structure" denotes a sacrificial structure that dictates the geometry and location of the later formed functioning gate structure. The "functional gate structure" operates to switch the semiconductor device from an "on" to "off" state, and vice versa.

In one embodiment, the sacrificial material that provides the sacrificial gate structure 25 may be composed of any material that can be etched selectively to the at least one of the material layers of the stack 10 of the at least two semiconductor materials 5a, 5b. In one embodiment, the sacrificial gate structure 25 may be composed of a silicon-including material, such as polysilicon. The sacrificial gate structure 25 may be formed using deposition (e.g., chemical vapor deposition) photolithography and etch processes (e.g., reactive ion etching).

Figure 14:
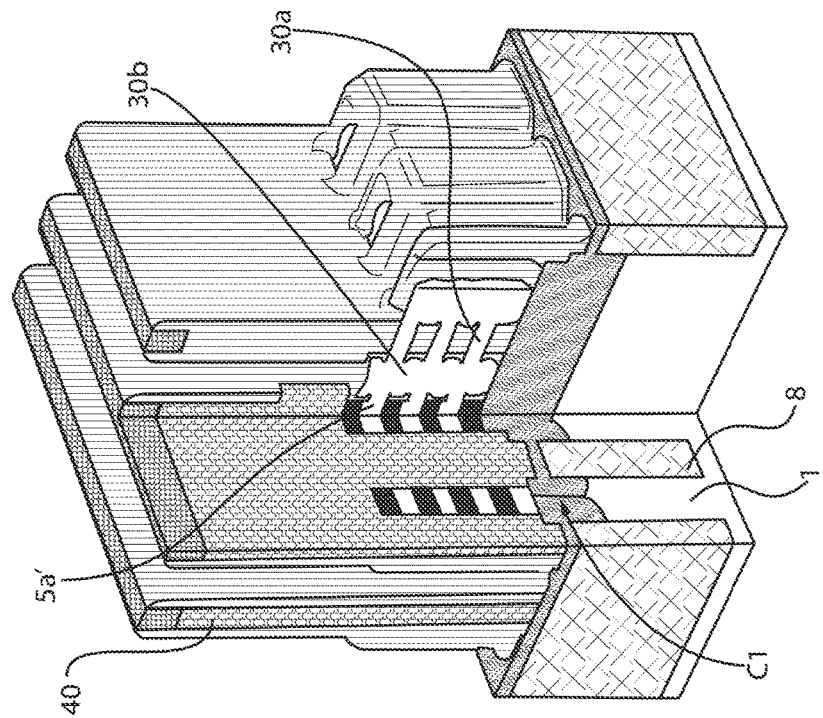
FIG. 14 is a perspective view depicting forming source and drain regions, removing the sacrificial gate structure, converting the stack of semiconductor material layers into nanosheets, and forming a functional gate structure in the gate opening formed by removing the sacrificial gate structure.

FIG. 14 depicts forming source and drain regions 30a, 30b, removing the sacrificial gate structure 20, converting the stack of semiconductor material layers into nanosheets, and forming a functional gate structure 40 in the gate opening formed by removing the sacrificial gate structure.

In some embodiments, forming the source and drain regions 30a, 30b may include an epitaxial growth process. The epitaxial semiconductor material may provide at least a portion of the source and drain regions 30a, 30b of the semiconductor device, and is formed on the source and drain portions of the stacks 10 that is on opposing sides of the channel region of the stacks 10. The term "epitaxial semiconductor material" denotes a semiconductor material that has been formed using an epitaxial deposition or growth process. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation. As used herein, the term "drain" means a doped region in semiconductor device located at the end of the channel region, in which carriers are flowing out of the transistor through the drain. The term "source" is a doped region in the semiconductor device, in which majority carriers are flowing into the channel region.

In some embodiments, the epitaxial semiconductor material that provides the source and drain regions 30a, 30b may be composed of silicon (Si), germanium (Ge), silicon germanium (SiGe), silicon doped with carbon (Si:C) or the epitaxial semiconductor material 35 may be composed of a type III-V compound semiconductor, such as gallium arsenide (GaAs).

Epitaxial deposition may be carried out in a chemical vapor deposition apparatus, such as a metal organic chemical vapor deposition (MOCVD) apparatus or a plasma enhanced chemical vapor deposition (PECVD) apparatus. The epitaxial semiconductor material for the source and drain regions 30a, 30b may be in situ doped to a p-type or n-type conductivity. The term "in situ" denotes that a dopant, e.g., n-type or p-type dopant, is introduced to the base semiconductor material, e.g., silicon or silicon germanium, during the formation of the base material. For example, an in situ doped epitaxial semiconductor material may introduce n-type or p-type dopants to the material being formed during the epitaxial deposition process that includes n-type or p-type source gasses. In the embodiments in which the semiconductor device being formed has p-type source and drain regions, and is referred to as a p-type semiconductor device, the doped epitaxial semiconductor material for the source and drain regions 30a, 30b is doped with a p-type dopant to have a p-type conductivity. As used herein, "p-type" refers to the addition of impurities to an intrinsic semiconductor that creates deficiencies of valence electrons. In a type IV semiconductor, such as silicon, examples of p-type dopants, i.e., impurities, include but are not limited to, boron, aluminum, gallium and indium. As used herein, "n-type" refers to the addition of impurities that contributes free electrons to an intrinsic semiconductor. In a type IV semiconductor, such as silicon, examples of n-type dopants, i.e., impurities, include but are not limited to antimony, arsenic and phosphorous.

In some embodiments, the method may continue with removing a replacement gate structure 25 and removing one of the two semiconductor materials, e.g., the second semiconductor material layer 5b, of the stack 10 in a channel region of the device. In some embodiments, removing the replacement gate structure 25 may begin with forming an interlevel dielectric layer, and planarizing the interlevel dielectric layer to expose an upper surface of the replacement gate structure 25. The replacement gate structure 25 may be removed using a wet or dry etch process.

Following removing the replacement gate structure 25, at least one of the material layers, i.e., the sacrificial semiconductor layer 5b, of the stacks 10 are removed selectively to the semiconductor material layer of the stack 10 that provides the nanosheets, i.e., the nanosheet semiconductor material layer 5a. For example, in one embodiment when the nanosheet semiconductor material layer 5a is composed of silicon (Si) and the sacrificial semiconductor material layer 5b is composed of silicon germanium (SiGe), the sacrificial semiconductor material layer 5b may be removed selectively to the nanosheet semiconductor material layer 5a with an etch process, such as a wet chemical etch.

In this example, following removal of one of the material layers of the stack 10, e.g., removal of the sacrificial semiconductor material layer 5b of the stack 10, a suspended channel structure is provided. By "suspended channel" it is meant that at least one semiconductor material layer is present overlying the substrate 1, wherein the sidewalls of the suspended channel are supported, e.g., anchored, in a structure, such as a spacer abutting the gate structure. Gate structure materials, electrically conductive materials and/or semiconductor materials may be formed in the space surrounding the suspended structures. In some embodiments, the suspended channel structures have a nanosheet geometry. The term "nanosheet" denotes a substantially two dimensional structure with thickness in a scale ranging from 1 to 100 nm. The width and length dimensions of the nanosheet may be greater than the thickness dimensions.

Still referring to FIG. 14, a functional gate structure 40 can be formed in the gate opening that is formed by removing the replacement gate structure 25. The functional gate structure 40 operates to switch the semiconductor device from an "on" to "off" state, and vice versa. The functional gate structure 45 may be formed by first depositing at least one gate dielectric on the suspended channel structures 40, e.g., nanowires or nanosheets, of the semiconductor device followed by filling the void with at least one gate conductor that is deposited on the at least one gate dielectric. The gate dielectric can be formed on the entirety of the exterior surface of the suspended channel structures 40.

The at least gate dielectric may comprise a semiconductor oxide, semiconductor nitride, semiconductor oxynitride, or a high k material having a dielectric constant greater than silicon oxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2ON_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. The at least one gate dielectric can be formed by chemical vapor deposition (CVD), such as plasma enhanced chemical vapor deposition (PECVD), metal organic chemical vapor deposition (MOCVD), or atomic layer deposition (ALD). In another embodiment, the at least one gate dielectric can be formed using thermal growth methods, such as oxidation.

The at least one gate conductor that is formed on the at least one gate dielectric may comprise an elemental metal (e.g., tungsten, titanium, tantalum, aluminum, nickel, ruthenium, palladium and platinum), an alloy of at least one elemental metal, an elemental metal nitride (e.g., tungsten nitride, aluminum nitride, and titanium nitride), an elemental metal silicide (e.g., tungsten silicide, nickel silicide, and titanium silicide) and multilayered combinations thereof. The at least one gate conductor can be formed utilizing a deposition process including, for example, chemical vapor deposition (CVD), plasma enhanced chemical vapor deposition (PECVD), physical vapor deposition (PVD), sputtering, atomic layer deposition (ALD) and other like deposition processes. In some embodiments, the at least one gate conductor may include a doped semiconductor material, e.g., n-type or p-type doped semiconductor material. For example, the at least one gate conductor may be composed of polysilicon, which can be doped within an appropriate impurity by utilizing either an in-situ doping deposition process or by utilizing deposition, followed by a step, such as ion implantation or gas phase doping, in which the appropriate impurity is introduced into the polysilicon.

In another aspect, a semiconductor device is described including a plurality of nanosheets 5s' electrically isolated from a supporting bulk semiconductor substrate 1 by an isolation region 13, 17. In one embodiment, the semiconductor device comprise a bulk semiconductor substrate 1; and an isolation region present in an upper surface of the bulk semiconductor substrate, the isolation region comprised of two dielectric fill regions 13, 17 having an interface C1 centrally positioned within the isolation region. A plurality of nanosheets 5a' are present overlying the isolation region 13, 17, wherein the interface C1 of the two dielectric fill regions 13, 17 is substantially centrally positioned under the width of the plurality of nano sheets 5a'. A gate structure present on a channel region portion of the plurality of nanosheets. Source and drain regions on opposing sides of the channel region portion of the plurality of nanosheets.

Having described preferred embodiments of a methods and structures disclosed herein, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming nanosheets comprising:
   providing at least two stacks of semiconductor material layers on a supporting bulk semiconductor substrate, wherein the at least two stacks of semiconductor material layers includes a sacrificial semiconductor layer of a first composition, and a nanosheet semiconductor layer of a second composition, and removing the sacrificial semiconductor layer to provide nanosheets composed of the nanosheet semiconductor layer;
   forming a first undercut region filled with a first dielectric material extending from an opening into the supporting bulk semiconductor substrate underlying the semiconductor material layers of the at least two stacks of semiconductor material layers; and
   forming a second undercut region into the supporting bulk semiconductor substrate filled with a second dielectric material from a side of the at least two stacks of semiconductor material layers that is opposite a side of the at least two stacks of semiconductor material layers at which the first undercut region is positioned, wherein the first and second dielectric materials provide an isolation region.

2. The method of claim 1, wherein the first composition is silicon germanium (SiGe), and the second composition is silicon (Si).

3. The method of claim 1, further comprising depositing a supporting dielectric layer over the at least two stacks of semiconductor material layers having said opening into the supporting bulk semiconductor substrate, and exposing a space between adjacent stacks of semiconductor material layer for the at least two stacks of semiconductor material layers prior to forming the first undercut region.

4. The method of claim 3, wherein said forming the first undercut region comprises an isotropic etch introduced through the opening into the supporting bulk semiconductor substrate, the first undercut region extending from the opening into the supporting bulk semiconductor substrate underlying the semiconductor material layers of the stack of semiconductor material layers.

5. The method claim 4, wherein the first dielectric material is deposited using atomic layer deposition (ALD).

6. The method of claim 4, further comprising removing the supporting dielectric layer, and applying an isotropic etch to form the second undercut region into the supporting bulk semiconductor substrate.

7. The method of claim 6, wherein the second dielectric material is blanket deposited by atomic layer deposition (ALD) and etched using an anisotropic etch process.

8. A method of forming a nanosheet device comprising:
   providing at least two stacks of semiconductor material layers on a supporting bulk semiconductor substrate;
   depositing a supporting dielectric layer over the at least two stacks having an opening exposing a space between adjacent stacks of semiconductor material layer for the at least two stacks of semiconductor material layers;
   forming a first undercut region extending from the opening into the supporting bulk semiconductor substrate underlying the semiconductor material layers of the at least two stacks of semiconductor material layers;
   filling the first undercut region with a first dielectric material;
   removing the supporting dielectric layer;
   forming a second undercut region into the supporting bulk semiconductor substrate from a side of the at least two stacks of semiconductor material layers that is opposite a side of the at least two stacks of semiconductor material layer at which the first undercut region is positioned;
   forming a second dielectric material to fill the second undercut region, wherein the first and second dielectric material provide an isolation region underlying an entirety of the semiconductor material layers; and
   positioning a channel region of a semiconductor device in a nanosheet provided by at least one of the semiconductor material layers in the stacks of semiconductor material layers.

9. The method of claim 8, wherein the at least two stacks of semiconductor material layers each include a sacrificial semiconductor layer of silicon germanium (SiGe), and a nanosheet semiconductor layer of silicon (Si), the method further including removing the sacrificial semiconductor layer to provide nanosheets composed of the nanosheet semiconductor layer that provide the channel region of the semiconductor device.

10. The method of claim 9, further comprising forming a sacrificial gate structure on a channel region of the at least two stacks of semiconductor material, forming epitaxial source and drain regions on opposing sides of the channel region; removing the sacrificial semiconductor layer, and replacing the sacrificial gate structure with a functional gate structure.

11. The method of claim 8, wherein said forming the first undercut region comprises an isotropic etch introduced through the opening.

12. The method claim 11, wherein the first dielectric material is deposited using atomic layer deposition (ALD).

13. The method of claim 12, further comprising applying an isotropic etch to form the second undercut region into the supporting bulk semiconductor substrate.

14. The method of claim 13, wherein the second dielectric material is blanket deposited by atomic layer deposition (ALD) and etched using an anisotropic etch process.

15. A semiconductor device comprising:
   a bulk semiconductor substrate;
   an isolation region present in an upper surface of the bulk semiconductor substrate, the isolation region comprised of two dielectric fill regions having an interface merged within the isolation region, wherein the two fill regions are comprised of a different composition dielectric material;

a plurality of nanosheets present overlying the isolation region, wherein the interface of the two dielectric fill regions is substantially merged under the width of the plurality of nanosheets;

a gate structure present on a channel region portion of the plurality of nanosheets; and source and drain regions on opposing sides of the channel region portion of the plurality of nanosheets.

16. The semiconductor device of claim 15, wherein an entirety of the plurality of nanosheets is separated from the bulk semiconductor substrate by the isolation region.

* * * * *